(12) United States Patent
Murthy et al.

(10) Patent No.: US 9,711,162 B2
(45) Date of Patent: Jul. 18, 2017

(54) METHOD AND APPARATUS FOR ENVIRONMENTAL NOISE COMPENSATION BY DETERMINING A PRESENCE OR AN ABSENCE OF AN AUDIO EVENT

(75) Inventors: Nitish Krishna Murthy, Allen, TX (US); Takahiro Unno, Richardson, TX (US); Edwin R. Cole, Highland Park, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 438 days.

(21) Appl. No.: 13/539,380

(22) Filed: Jun. 30, 2012

(65) Prior Publication Data

US 2013/0013304 A1 Jan. 10, 2013

Related U.S. Application Data

(60) Provisional application No. 61/504,470, filed on Jul. 5, 2011.

(51) Int. Cl.

| G10L 21/00 | (2013.01) |
|---|---|
| G10L 15/00 | (2013.01) |
| H03G 3/00 | (2006.01) |
| G10L 21/0208 | (2013.01) |
| G10L 15/20 | (2006.01) |
| G10L 25/78 | (2013.01) |
| G10L 25/84 | (2013.01) |

(52) U.S. Cl.
CPC .......... *G10L 21/0208* (2013.01); *G10L 15/20* (2013.01); *G10L 25/78* (2013.01); *G10L 25/84* (2013.01); *H03G 3/001* (2013.01)

(58) Field of Classification Search
CPC ...... G10L 21/0208; G10L 25/78; H03G 3/001
USPC .......................................... 704/226; 381/107
See application file for complete search history.

(56) References Cited

U.S. PATENT DOCUMENTS

| 6,453,289 B1* | 9/2002 | Ertem ................. G10L 21/0208 |
| | | 704/225 |
| 6,766,176 B1 | 7/2004 | Gupta et al. |
| 6,868,162 B1* | 3/2005 | Jubien et al. ................. 381/107 |
| 7,412,382 B2* | 8/2008 | Noda ...................... G10L 25/78 |
| | | 379/208.01 |

(Continued)

OTHER PUBLICATIONS

"Ultra Low Power Stereo Audio Codec With Embedded miniDSP", Texas Instruments Incorporated, Sep. 2008, revised Oct. 2008, pp. 1-168.

(Continued)

*Primary Examiner* — Farzad Kazeminezhad
(74) *Attorney, Agent, or Firm* — Tuenlap D. Chan; Charles A. Brill; Frank D. Cimino

(57) ABSTRACT

A method of environmental noise compensation a speech audio signal is provided that includes estimating a fast audio energy level and a slow audio energy level in an audio environment, wherein the speech audio signal is not part of the audio environment, and applying a gain to the speech audio signal to generate an environment compensated speech audio signal, wherein the gain is updated based on the estimated slow audio energy level when the estimated fast audio energy level is not indicative of an audio event in the audio environment and the estimated gain is not updated when the estimated fast audio energy level is indicative an audio event in the audio environment.

15 Claims, 11 Drawing Sheets

(56) References Cited

U.S. PATENT DOCUMENTS

| | | |
|---|---|---|
| 7,577,248 B2 | 8/2009 | McCree |
| 7,881,927 B1 | 2/2011 | Reuss |
| 2005/0240401 A1* | 10/2005 | Ebenezer .................... 704/226 |
| 2009/0012786 A1 | 1/2009 | Zhang et al. |
| 2009/0088224 A1 | 4/2009 | Le Gall et al. |
| 2011/0064242 A1 | 3/2011 | Parikh et al. |
| 2011/0123019 A1 | 5/2011 | Gowreesunker et al. |
| 2012/0128168 A1 | 5/2012 | Gowreesunker et al. |

OTHER PUBLICATIONS

R. Venkatesha Prasad et al, "Comparison of Voice Activity Detection Algorithms for VoIP", Proc. Seventh IEEE Symposium on Computers and Communications (ISCC'02), Jul. 2002, pp. 1-6.
Bastian Sauert and Peter Vary, "Near End Listening Enhancement: Speech Intelligibility Improvement in Noisy Environments", Proc. 2006 IEEE International Conference on Acoustics, Speech and Signal Processing, May 2006, pp. 493-496.

* cited by examiner

METHOD AND APPARATUS FOR ENVIRONMENTAL NOISE COMPENSATION BY DETERMINING A PRESENCE OR AN ABSENCE OF AN AUDIO EVENT

CROSS-REFERENCE TO RELATED APPLICATIONS

This application claims benefit of U.S. Provisional Patent Application Ser. No. 61/504,470, filed Jul. 5, 2011, which is incorporated herein by reference in its entirety.

BACKGROUND OF THE INVENTION

Field of the Invention

Embodiments of the present invention generally relate to environmental noise compensation, also referred to as noise adaptive volume control, in audio signals.

Description of the Related Art

Noise adaptive volume control or environmental noise compensation is an effective approach for increasing the intelligibility of audio signals such as speech in noisy environments. In general, environmental noise compensation automatically increases or decreases the volume and frequency shape of desired signal content, e.g., speech, by an amount proportional to the ambient noise level. Current techniques for environmental noise compensation may not be suitable for use in limited resource devices such as cellular telephones.

SUMMARY

Embodiments of the present invention relate to methods and apparatus for environmental noise compensation. In one aspect, a method of environmental noise compensation a speech audio signal is provided that includes estimating a fast audio energy level and a slow audio energy level in an audio environment, wherein the speech audio signal is not part of the audio environment, and applying a gain to the speech audio signal to generate an environment compensated speech audio signal, wherein the gain is updated based on the estimated slow audio energy level when the estimated fast audio energy level is not indicative of an audio event in the audio environment and the estimated gain is not updated when the estimated fast audio energy level is indicative an audio event in the audio environment.

In one aspect, a method of environmental noise compensation a speech audio signal is provided that includes tracking a noise level and a speech level in an audio environment, wherein the speech audio signal is not part of the audio environment, determining whether or not speech is present in the audio environment based on the noise level and the speech level, updating a gain based on the noise level when speech is not present in the audio environment, freezing the gain at a current level when speech is present in the audio environment, and applying the gain to the speech audio signal to generate an environment compensated speech audio signal.

In one aspect, a digital system is provided that includes a processor, means for capturing audio signals indicative of an audio environment of the digital system, means for receiving a speech audio signal from another digital system not in the audio environment, a speaker configured to reproduce a received speech audio signal, and a memory configured to store software instructions that, when executed by the processor, cause the digital system to perform a method of environmental noise compensation of the speech audio signal. The method includes estimating a fast audio energy level and a slow audio energy level in the audio environment, and applying a gain to the speech audio signal to generate an environment compensated speech audio signal, and reproducing the environment compensated speech audio signal in the speaker, wherein the gain is updated based on the estimated slow audio energy level when the estimated fast audio energy level is not indicative of an audio event in the audio environment and the estimated gain is not updated when the estimated fast audio energy level is indicative an audio event in the audio environment.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

Figure 1:
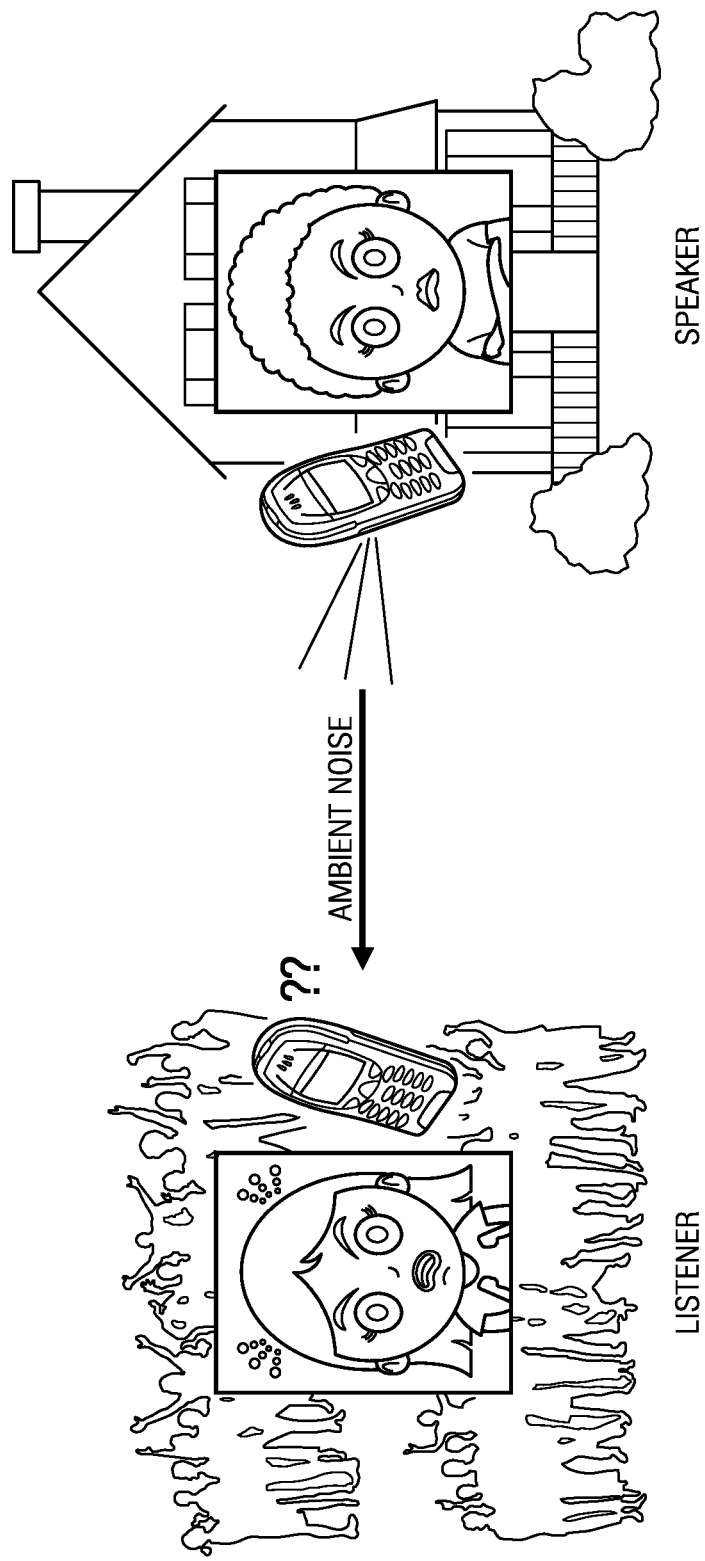
FIG. 1 is an example.

Specific embodiments of the invention will now be described in detail with reference to the accompanying figures. Like elements in the various figures are denoted by like reference numerals for consistency.

The level of ambient acoustic noise present in an audio signal captured by a microphone is indicative of the amount of ambient noise, i.e., background noise, present in the environment where the microphone is located. Ambient noise may be sound from the environments such as road noise in a moving automobile, wind noise, one or more other people speaking, music, etc. High levels of ambient noise are indicative of noisy environments and low levels of ambient noise are indicative of quiet environments. There are known techniques for environmental noise compensation that use the level of ambient noise to automatically adjust the volume of the desired content of another audio signal to which someone in the environment is listening as the level of ambient noise changes.

Consider the example of FIG. 1. The speaker and the listener are having a telephone conversation. The speaker, located in a quiet home or office, is communicating via telephone with the listener, who is located in a noisy environment. The listener may have difficulty hearing and/or understanding the speaker's voice because of the ambient noise in her environment.

Figure 2:
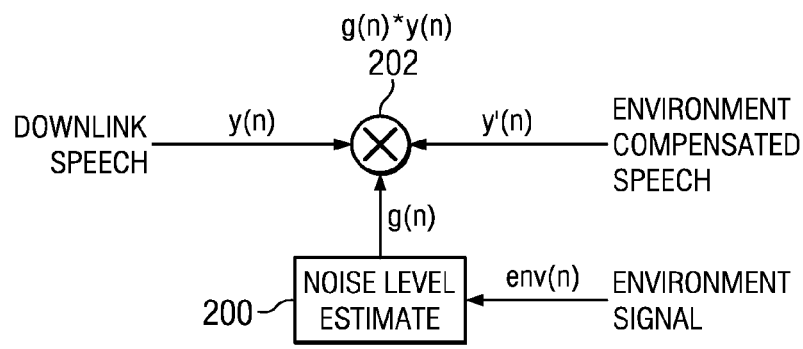
FIG. 2 is a block diagram of a prior art system for environmental noise compensation.

To improve the ability of the listener to hear the speaker's voice, environmental noise compensation (ENC) may be implemented in the listener's cellular phone. FIG. 2 illustrates a common prior art ENC technique. In this technique, the ambient noise level in the listener's environment is estimated 200 from an environment audio signal env(n) captured using a microphone on the listener's cellular phone, i.e., the uplink audio signal. Note that n is the audio sample number. The microphone used to capture the environment audio signal is the microphone on the cellular phone positioned to capture the listener's voice. A gain g(n) is derived from the noise level estimation and applied 202 to the downlink speech signal to generate an environment compensated speech signal that is output to a speaker on the listener's cellular telephone. Accordingly, the volume of the speech signal is increased based on the estimated amount of ambient noise in the environment.

When the listener speaks, the environment audio signal env(n) includes speech and ambient noise. The addition of the speech to the signal, and the natural variation between loud and soft in the speech, will cause false noise estimations that may lead to undesirable gain pumping on the downlink speech signal. In general, gain pumping is an undesirable gain variation caused by erroneous noise floor estimation. Further, excessive amplification of the downlink speech signal by the ENC may cause, for example, signal saturations and clipping, mechanical vibration, and over-driving of the small speaker on the listener's cell phone, thus reducing the intelligibility of the speech.

Embodiments of the invention provide environmental noise compensation that avoids gain pumping by employing audio event adaptive noise estimation and gain computation. Audio event adaptive noise estimation may also be referred to as audio event aware noise estimation or self adjusting, audio event aware noise estimation. An audio event is a short term acoustic event picked up by a microphone that is not a part of the long term noise environment, e.g., speech or turn signal noise in a car environment. The environment audio signal is monitored using a voice activity detection (VAD) technique to detect the occurrence of audio events. When there is a change in the received environment audio signal, the gain computation is frozen until the change is determined to be a long term change, i.e., a change in the environment, or a short term change, i.e., an audio event. If the change not due to an audio event, then the gain computation is modified to reflect a change in the estimated noise level. In some embodiments, a single audio capture device, e.g., a microphone, is used to capture the environment audio signal. In some embodiments, two or more audio capture devices are used to achieve better noise estimation.

In some embodiments, to address the potential for excessive amplification of the speech signal, a technique for intelligibility enhancement is used. In this technique, the speech signal is filtered to boost the signal at frequencies to which the human ear is most sensitive. The filtered signal and the original signal are then mixed in amounts proportional to the gain to generate the environment compensated signal.

Figure 3:
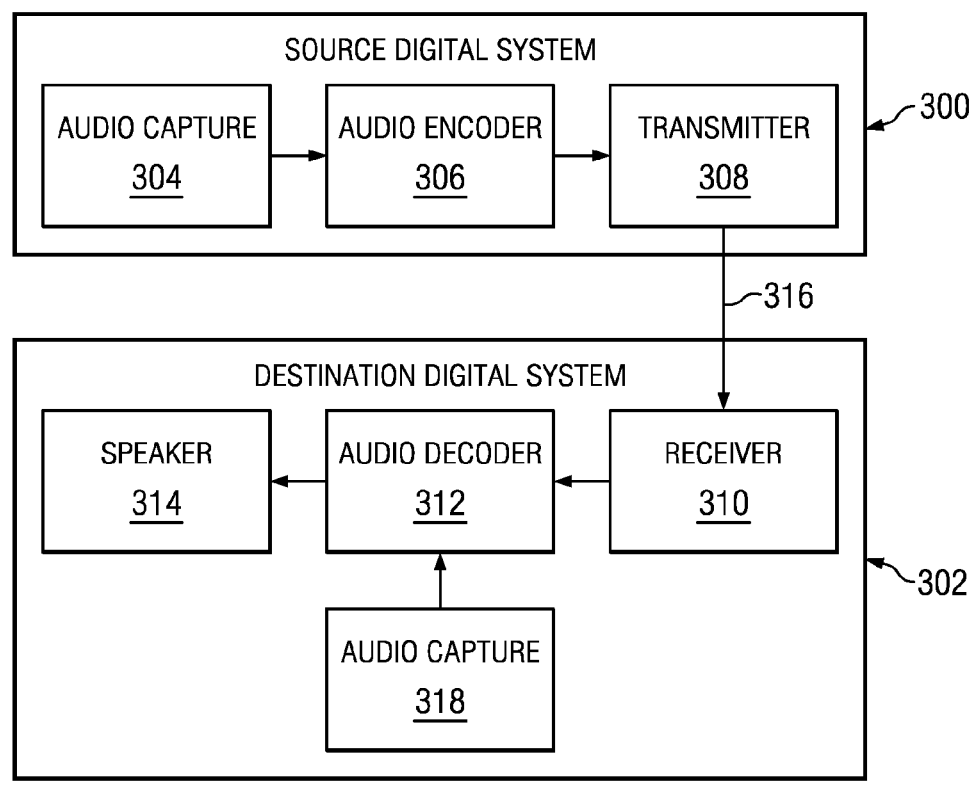
FIG. 3 is a block diagram of an example digital system.

FIG. 3 shows a block diagram of an example system. The system includes a source digital system 300 that transmits encoded digital audio signals to a destination digital system 302 via a communication channel 316. The source digital system 300 includes an audio capture component 304, an audio encoder component 306, and a transmitter component 308. The audio capture component 304 includes functionality to capture one or more audio signals. In some embodiments of the invention, the audio capture component 304 also includes functionality to convert the captured audio signals to digital audio signals. The audio capture component 304 also includes functionality to provide the captured analog or digital audio signals to the audio encoder component 306 for further processing. The audio capture component 304 may include one or more audio capture devices, e.g., analog microphones, digital microphones, microphone arrays, etc. The audio capture devices may be arranged such that the captured audio signals each include a mixture of speech (when a person is speaking) and ambient noise.

The audio encoder component 306 includes functionality to receive the one or more audio signals from the audio capture component 304 and to process the audio signals for transmission by the transmitter component 308. In some embodiments, the processing includes converting analog audio signals to digital audio signals when the received audio signals are analog. The processing includes encoding the digital audio signals in accordance with an encoding standard and provides the encoded audio signal to the transmitter component 308.

The transmitter component 308 includes functionality to transmit the encoded audio data to the destination digital system 302 via the communication channel 316. The communication channel 316 may be any communication medium, or combination of communication media suitable for transmission of the encoded audio sequence, such as, for example, wired or wireless communication media, a local area network, and/or a wide area network.

The destination digital system 302 includes a receiver component 310, an audio decoder component 312, a speaker component 314, and an audio capture component 318. The receiver component 310 includes functionality to receive the encoded audio data from the source digital system 300 via the communication channel 316 and to provide the encoded audio data to the audio decoder component 312 for decoding.

The audio capture component 318 may include one or more audio capture devices, e.g., analog microphones, digital microphones, microphone arrays, etc. The audio capture devices may be arranged such that the captured audio signals may each include a mixture of speech (when a person is speaking) and ambient noise. In some embodiments, one audio capture device, i.e., a primary audio capture device, is arranged to optimally capture the voice of a person speaking and to provide the captured primary audio signal to the audio decoder 312. For example, if the destination digital system 302 is a cellular telephone, the primary audio capture device may be a microphone placed at the bottom front center of the cellular telephone in a typical location of a microphone for capturing the voice of a user. In another example, the primary audio capture device may be a microphone in a headset worn by the user. In some embodiments, one audio capture device is a primary audio capture device and at least one other audio capture device, i.e., a secondary audio capture device, is placed apart from the primary audio device to capture an audio signal from a different perspective. Both the primary and the secondary audio signals are provided to the audio decoder 312 in such embodiments. If the destination digital system 302 is a cellular telephone, the secondary audio capture device may be, for example, a microphone placed on the back or side of the cellular telephone.

In general, the audio decoder component 312 reverses the encoding process performed by the audio encoder component 306 to reconstruct the audio data. The processing performed by the audio decoder component 312 includes performing a method for environmental noise compensation on the reconstructed audio signal as described herein. In some embodiments, the ENC method is performed using an audio signal captured by a primary audio device in the audio capture component 318. In some embodiment, the ENC method is performed using audio signals captured by a primary audio device and a secondary audio device in the audio capture component 318.

The reconstructed, compensated audio data may then be reproduced by the speaker component 314. The speaker component 314 may be any suitable audio reproduction device.

In some embodiments, the source digital system 300 may also include a receiver component, an audio decoder component, and a speaker component and/or the destination digital system 302 may include a transmitter component and an audio encoder component for transmission of audio sequences in both directions. Further, the audio encoder component 306 and the audio decoder component 312 may perform encoding and decoding in accordance with one or more audio compression standards. The audio encoder component 306 and the audio decoder component 312 may be implemented in any suitable combination of software, firmware, and hardware, such as, for example, one or more digital signal processors (DSPs), microprocessors, discrete logic, application specific integrated circuits (ASICs), field-programmable gate arrays (FPGAs), etc. Software implementing all or part of the audio encoder and/or audio decoder may be stored in a memory, e.g., internal and/or external ROM and/or RAM, and executed by a suitable instruction execution system, e.g., a microprocessor or DSP. Analog-to-digital converters and digital-to-analog converters may provide coupling to the real world, modulators and demodulators (plus antennas for air interfaces) may provide coupling for transmission waveforms, and packetizers may be included to provide formats for transmission.

Figure 4:
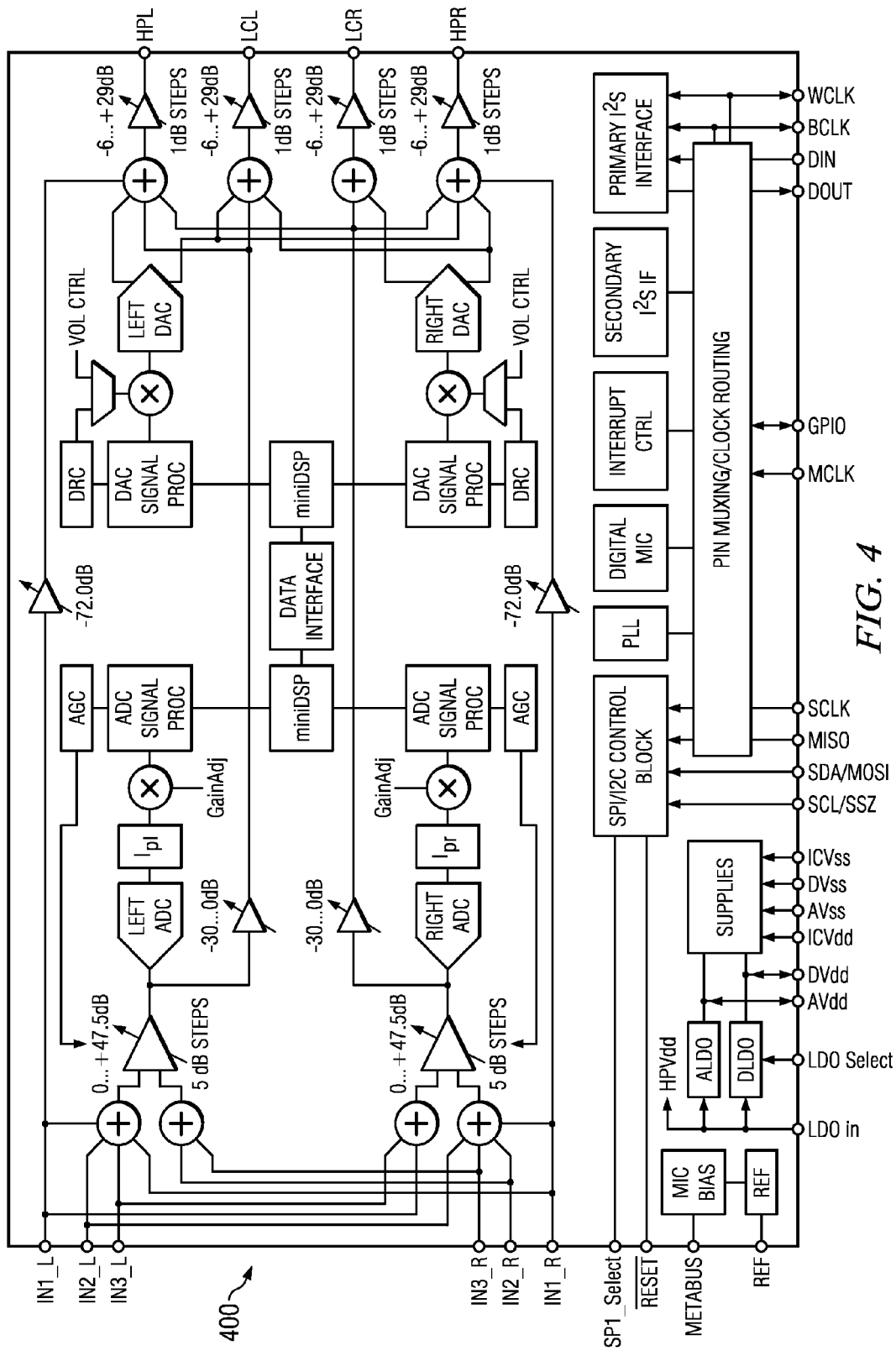
FIG. 4 is a block diagram of an audio codec.

FIG. 4 shows a simplified block diagram 400 of a low power stereo audio codec available from Texas Instruments, Inc. This audio codec is presented as an example of one audio codec that may be embodied in a destination digital system 302 and configured to execute a method for environmental noise compensation as described herein.

The audio codec 400 include circuitry to accept inputs from two analog microphones and/or inputs from two digital microphones, ADC (analog-to-digital converter) circuitry for each analog input, and DAC (digital-to-analog converter) circuitry. The audio codec 400 further includes two mini-DSPs that may be used to decode audio signals, e.g., downlink audio signals, received via an audio data interface (Primary or Secondary I²S). Part of the decoding may include performing a method of environmental noise compensation as described herein on the decoded signal using environment audio signals received from a digital microphone (Digital Mic) and/or analog microphones (Left ADC and Right ADC). More specifically, one or both of the mini-DSPs may be used to execute software instructions implementing a method for environmental noise compensation as described herein as part of decoding an audio signal. The software instructions may be loaded into the device after power-up of a digital system incorporating the device. The functionality of the components of the audio codec 400 will be apparent to one of ordinary skill in the art. Additional information regarding the functionality of this codec may be found in the product data sheet entitled "TLV320AIC3254, Ultra Low Power Stereo Audio Codec with Embedded miniDSP," available at http://focus.ti.com/lit/ds/symlink/tlv320aic3254.pdf. The data sheet is incorporated by reference herein.

FIGS. 5, 7, 9, and 11 are block diagrams of systems for environmental noise compensation and FIGS. 6, 8, 10, and 12 are flow diagrams of methods for environmental noise compensation. In these systems and methods, a technique for voice activity detection (VAD) is used to prevent gain pumping caused in prior art ENC due to the presence of speech or other audio content with the same or higher energy level as speech in the environment audio signal. This technique exploits the fact that speech energy has faster energy modulation than the slowly varying ambient noise energy. Two signal measurements, i.e., trackers, are employed in parallel. One of the trackers is a slow energy tracker that tracks the slow changes in ambient noise energy, and the other noise tracker is a fast energy tracker that tracks the fast changes introduced by speech or other audio events that are not part of the ambient noise. The energy outputs from each of these trackers are compared at each sample, and if the level difference is greater than an energy level threshold, the gain computation is frozen to avoid gain pumping. For convenience of description, the slow energy tracker is referred to as a noise tracker and the fast energy tracker is referred to as a speech tracker. Also, the slow energy is referred to as noise energy and the fast energy is referred to as speech energy.

Figure 5:
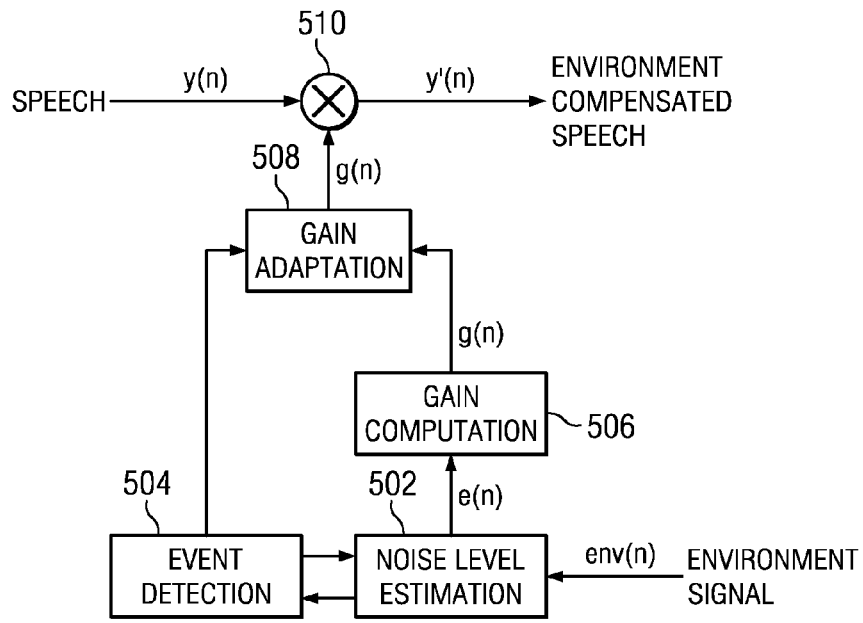
FIGS. 5, 7, 9, and 11 are block diagrams of systems for environmental noise compensation.

FIG. 5 is a block diagram of a system for environmental noise compensation of a speech audio signal. The system includes a noise level estimation component 502, an event detection component 504, a gain computation component 506, a gain adaptation component 508, and a multiplier 510.

The noise level estimation component 502 receives samples env(n) of an environment audio signal captured by a microphone and estimates the noise energy and the speech energy in the environment audio signal in collaboration with the event detection component 504. The noise level estimation component 502 implements the noise tracker and the speech tracker. When the noise level estimation component 502 receives an environment audio sample, the noise tracker computes a noise energy estimation e(n) based on the received sample env(n) according to the following formula:

$$e(n) = \alpha_{noise} * e(n-1) + (1-\alpha_{noise}) * \text{env}(n)^2$$

where, e(n−1) is the previous noise energy estimate. The speech tracker also computes a speech energy estimation $e_{speech}(n)$ based on the received sample env(n) according to the following formula:

$$e_{speech}(n) = \alpha_{speech} * e_{speech}(n-1) + (1-\alpha_{speech}) * \text{env}(n)^2$$

where $e_{speech}$ (n−1) is the previous speech energy estimate and $\alpha_{speech} > \alpha_{noise}$. The values of the smoothing parameters $\alpha_{noise}$ and $\alpha_{speech}$ may be selected based on criteria such as sample rate, expected noise characteristics of the environment, and the desired VAD accuracy. In general, the value of $\alpha_{speech}$ is significantly higher than the value of $\alpha_{noise}$. These smoothing parameters are used because the signal power computed from a single input sample may have a large energy fluctuation which could cause voice activity detection to excessively switch between detected and not detected. In some embodiments, the values of these parameters are empirically determined constants. In some embodiments, the values of the parameters may adapt with changes in the environment.

These initial noise and speech energy estimates are provided to the event detection component 504. The event detection component 504 compares the noise and speech energy estimates to an energy level threshold to determine if a high level of energy is present consistent with speech. This comparison may be made according to the following test:

$$e(n) < e_{speech}(n) * en\_th$$

where en_th is the energy level threshold. If this test is true, the event detection component 504 indicates no audio event to the noise level estimation component 502 and to the gain adaptation component 508. If the test is false, the event detection component 504 indicates an audio event to the noise level estimation component 502 and to the gain adaptation component 508. The value of the energy level threshold en_th may be selected based on the typical noise level in the environment. In some embodiments, the value of this threshold is an empirically determined constant. In some embodiments, the value of the threshold may adapt with changes in the noise level in the environment. The comparison may also be made in other ways than that shown above. For example, the comparison may be made according to the following test:

$$e(n)/e_{speech}(n) < en\_th.$$

For long speech utterances in the environment, e(n) approaches $e_{speech}(n)$, which may cause gain pumping in the environment compensated speech due to incorrect noise estimates. To correct the noise estimates, the response of the noise tracker to the occurrence of audio events is slowed down by applying a corrective factor to the noise estimates that cause an audio event to be detected. Similarly, a corrective factor is applied to the noise estimates that do not result in an audio event to progressively increase such noise level estimates for faster response to changes in the noise level. This corrective factor is made progressive to avoid sudden, discrete changes in the estimated noise level.

Accordingly, the noise level estimation component 502 modifies the noise energy estimate e(n) for a sample env(n) according whether or not an audio event is indicated by the event detection component 504 from the initial noise and speech energy estimates. More specifically, if no audio event is indicated, the noise energy estimate e(n) is modified according to the following formula:

$$e(n) = \alpha_{fast} * e(n-1) + (1-\alpha_{fast}) * e(n), \text{ and}$$

if an audio event is indicated, the noise energy estimate e(n) is modified according to the following formula:

$$e(n) = \alpha_{slow} * e(n-1) + (1-\alpha_{slow}) * e(n),$$

where $\alpha_{fast} < \alpha_{slow}$. The values of the correction factors $\alpha_{fast}$ and $\alpha_{slow}$ are selected to control the speed with which the noise energy estimate changes by controlling the contribution of the noise estimated from env(n) to the final noise estimate. In effect, these correction factors smooth the energy level transitions between audio events and ambient noise. In general, the value of $\alpha_{slow}$ is significantly higher than the value of $\alpha_{fast}$. In some embodiments, the values of these parameters are empirically determined constants. In some embodiments, the values of the parameters may adapt with changes in the environment.

The final noise energy estimate e(n) is provided to the gain computation component 506. The gain computation component 506 computes a gain $g_{env}(n)$ based on the noise energy estimate for the current sample by applying a gain mapping function β to the noise energy estimate e(n): $g_{env}(n) = \beta(e(n))$. The computed gain is provided to the gain adaptation component 508.

In general, a gain mapping function maps gain levels to noise levels. Any suitable gain mapping technique may be used. The mapping may be, for example, linear or logarithmic. For example, a linear mapping as per $$g(n) = b * e(n) + c$$

may be used where the constants b and c are determined by factors such as the minimum noise energy expected, the maximum noise energy expected, and the maximum and minimum gains expected, i.e., $$b = (max\_gain - min\_gain)/(max\_noise\_power - min\_noise\_energy)$$

and $$c = min\_gain - b * min\_noise\_energy.$$

In another example, the mapping may be implemented using a look-up table.

The gain adaptation component 508 determines the gain to be applied to the speech signal y(n). The gain adaptation component 508 operates to freeze the gain computation at the current gain when an audio event is detected by the event detection component 504. The gain adaptation component 508 holds the gain at the same level until an environment audio sample is processed that does not cause an audio event to be detected. This "freezing" of the gain helps prevent sudden changes in the gain which may cause undesirable gain fluctuations for the listener.

More specifically, when no audio event is detected at the current environment audio sample env(n), the gain adaptation component 508 adapts the gain g(n) according to the following formula:

$$g(n) = \alpha * g(n-1) + (1-\alpha) * g_{env}(n)$$

and when an audio event is detected, the gain adaptation component 508 adapts the gain g(n) according to the following formula:

$$g(n) = g(n-1)$$

where g(n−1) is the gain computed at the previous environment audio sample env(n−1). The parameter α is used to tune the gain response to changes in noise level. The value of α may be slow or fast depending on the desired response time to changes in the noise level. In some embodiments, the value of this parameter is an empirically determined constant. In some embodiments, the value of the parameter may adapt with changes in the environment.

The gain g(n) is provided as one input to the multiplier 510. The other input to the multiplier 510 is samples of the speech signal y(n). The multiplier 510 multiplies the speech signal y(n) with the gain g(n) to generate the output environment compensated speech signal y'(n).

Figure 6:
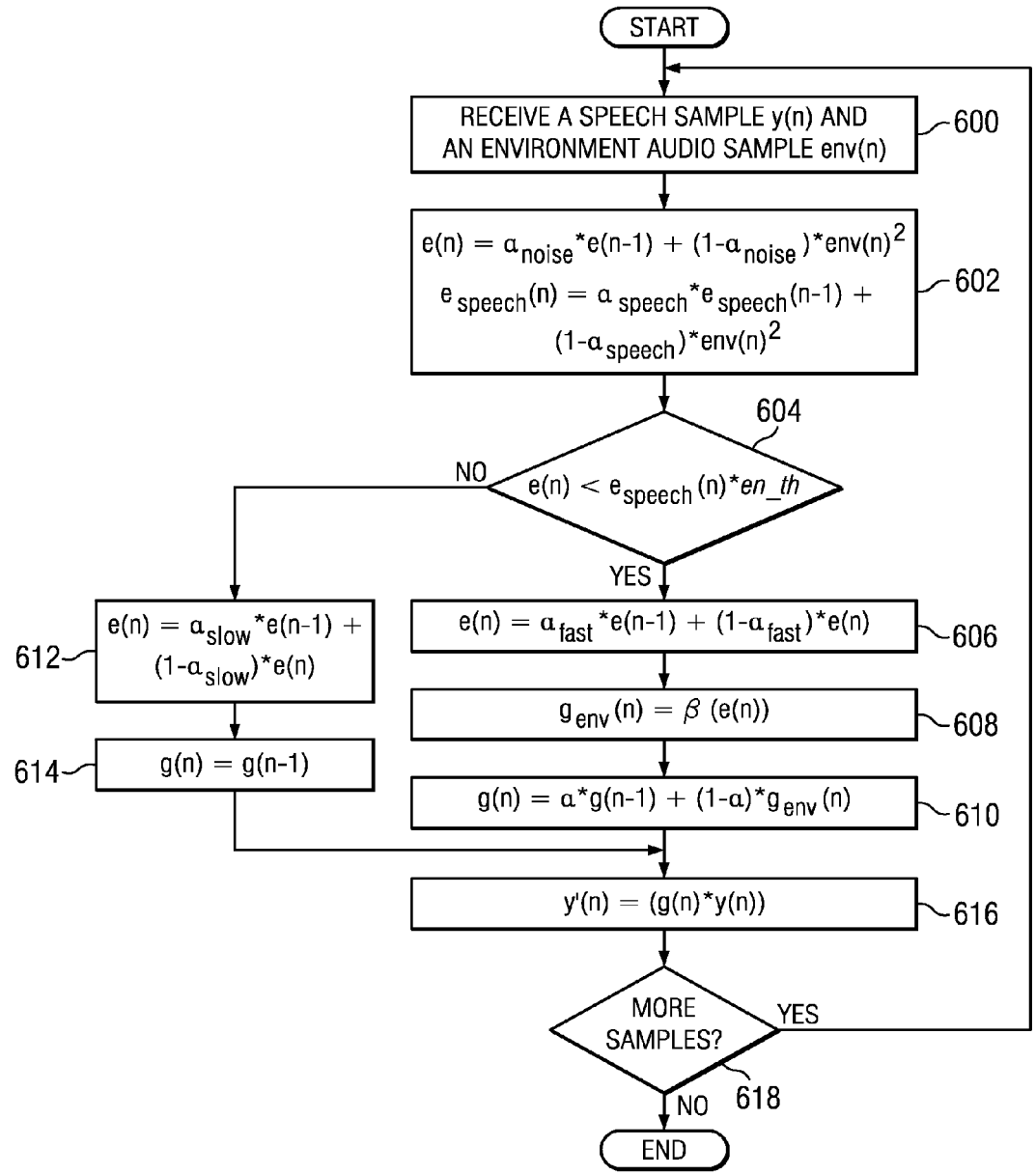
FIGS. 6, 8, 10, and 12 are flow diagrams of methods for environmental noise compensation.

FIG. 6 is a flow diagram of a method for environmental noise compensation of a speech signal in a digital system (e.g., a cellular telephone, a speakerphone, a computer system providing VOIP (Voice over Internet Protocol) communication, etc.). Initially, a sample y(n) of a speech audio signal and a sample env(n) of an environment audio signal are received 600. The environment audio signal is received from a microphone embodied in the digital system and the speech audio signal is received as a transmission from another digital system. The microphone is arranged to capture the speech of a person speaking, and any other sound in the environment where the speech is generated, i.e., ambient noise. Thus, when the person is speaking, the environment audio signal is a mixture of an audio signal with speech content and audio signals from other sounds in the environment. And, when the person is not speaking, the environment audio signal is a mixture of audio signals of other sounds in the environment.

A noise energy estimate e(n) and a speech energy estimate $e_{speech}(n)$ are then updated 602 based on the received environment audio sample env(n). The smoothing parameters $\alpha_{noise}$ and $\alpha_{speech}$ are previously described herein.

A determination 604 is then made as to whether or not there is speech in the environment audio signal. This determination is made comparing by the noise energy estimate e(n) and the speech energy estimate $e_{speech}(n)$ to an energy level threshold en_th to determine if a high level of energy is present consistent with speech. The energy level threshold en_th is previously described herein.

If speech is not present 604 in the environment audio signal, the noise energy estimate e(n) is modified 606 to allow a faster response to noise energy changes in the environment audio signal than if speech were present. The correction factor $\alpha_{fast}$ is previously described herein. A gain $g_{env}(n)$ is then determined 608 from the noise energy estimate e(n). Determination of the gain $g_{env}(n)$ is previously described herein.

The gain g(n) to be applied to the received sample y(n) of the speech audio signal is then computed 610 based on the gain $g_{env}(n)$ determined from the noise energy estimate e(n). The parameter α is previously described herein. The gain g(n) is then applied 616 to the received speech audio signal sample y(n) to generate the output environment compensated speech signal sample y'(n). The method is then repeated 618 for the next speech and environment samples, if any.

If speech is present 606 in the environment audio signal, the noise energy estimate e(n) is modified 612 to cause a slower response to noise energy changes in the environment audio signal than if speech were not present. The correction factor $\alpha_{slow}$ is previously described herein. The gain g(n) to be applied to the received sample y(n) of the speech audio signal is also set 614 to be the gain g(n−1) computed for the previous environment and speech samples. The gain g(n) is then applied 616 to the received speech audio signal sample y(n) to generate the output environment compensated speech signal sample y'(n). The method is then repeated 618 for the next speech and environment samples, if any.

Figure 7:
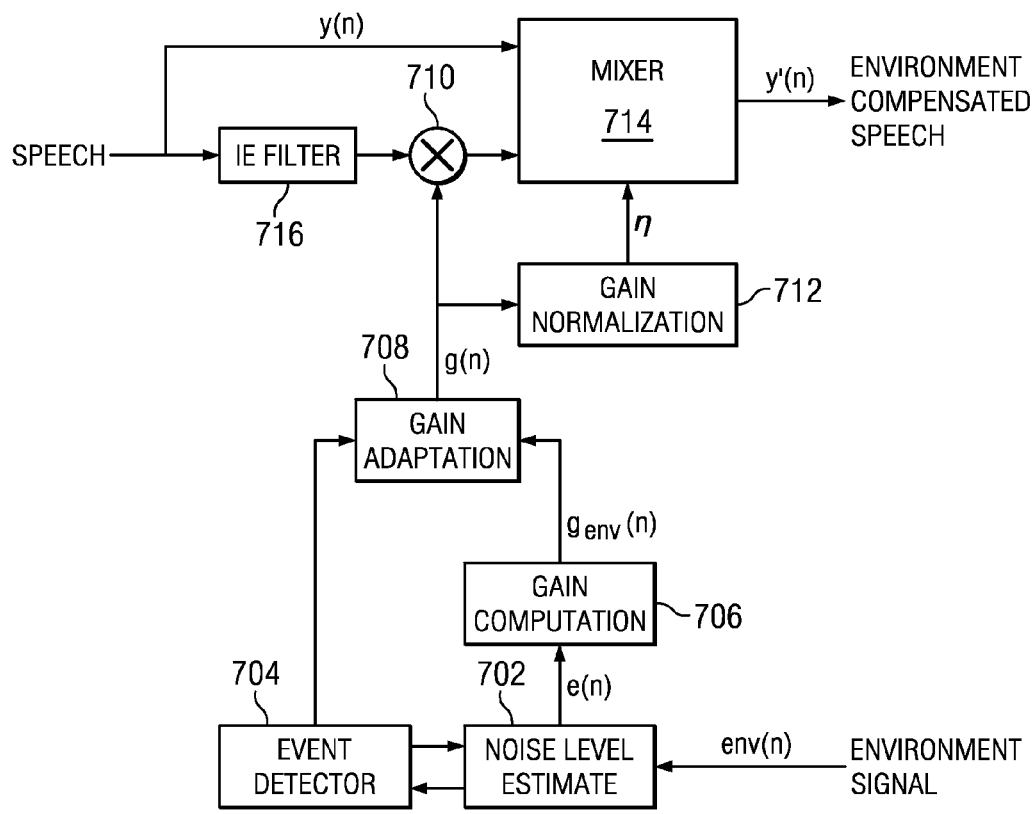

FIG. 7 is a block diagram of a system for environmental noise compensation of a speech audio signal in which intelligibility of the speech is also enhanced. This system is essentially the system of FIG. 5 with components added to enhance the intelligibility of the environment compensated speech. If a high gain is directly applied to speech, the intelligibility of the speech may be reduced due to limitations and imperfections in the loudspeaker and other circuits reproducing the gain-compensated speech signal. This may be particularly apparent at low frequencies.

A filter may be used to increase the intelligibility by boosting the speech signal at the frequencies to which the ear is most sensitive (1000-2000 Hz). However, using a static filter to avoid low frequencies at all times may reduce the naturalness of the speech at lower noise levels. To enhance intelligibility while retaining naturalness of the speech, the gain computed by the environment noise compensation can be normalized, and the original speech audio signal and the intelligibility boosted speech audio signal, i.e., the filtered speech audio signal, can be mixed in amounts proportional to the normalized gain. More specifically, the samples y'(n) of the environment compensated speech signal with intelligibility enhancement may be computed as per the formula:

$$y'(n)=y(n)*(1-\eta)+(g(n)*\text{conv}(y(n),f))*\eta$$

where η is the normalized gain, f is the filter, and cony is convolution. The normalized gain η is between 0 and 1. At η=0, there is little or no ambient noise in the environment and only the unfiltered speech audio signal is used and at η=1, the maximum gain is applied to the speech audio signal and only filtered speech is used.

The system of FIG. 7 includes a noise level estimation component 702, an event detection component 704, a gain computation component 706, and a gain adaptation component 708. The functionality of these components is as previously described in reference to FIG. 5 for components of the same name. These components operate to generate gain g(n) to be applied to samples y(n) of the speech audio signal. This gain g(n) provides one input to the multiplier 710.

The intelligibility enhancement filter component 716 applies a filter to the samples y(n) of the speech audio signal to boost the speech signal at the frequencies to which the human ear is most sensitive. More specifically, the filter component 716 computes a filtered speech sample $y_f(n)$ according to the following formula:

$$y_f(n)=\text{conv}(y(n),f)$$

where f is the filter implemented by the filter component 716. Any suitable filter or combination of filters may be implemented by the filter component 716. For example, a combination of a high pass filter and an equalizer may be used. Other filters that may be used include a band pass filter or a treble-shelf filter. In some embodiments, the filter(s) used may be empirically determined. In some embodiments, the filter(s) may be adapted based on the spectral content of the noise in the environment audio signal. The filtered speech samples $y_f(n)$ are provided as one input to the multiplier 710.

The multiplier 710 multiplies each filtered speech sample by the gain g(n) and provides the resulting gained filtered speech samples $y_{fg}(n)$ as one input to the mixer component 714. More specifically, the multiplier applies a gain g(n)) to a filtered speech sample $y_f(n)$ according to the following formula:

$$y_{fg}(n)=(g(n)*y_f(n)).$$

The gain normalization component 712 receives the gain g(n) is an input and computes the normalized gain η according to the following formula:

$$\eta=g(n)/\text{max\_gain}$$

where max_gain is a design parameter specifying the maximum permitted loudness of the ENC system. This maximum gain may be determined based on loudspeaker specifications, acoustic characteristics, and other performance specifications of the digital system in which the ENC system is to be implemented. The normalized gain η is provided as one input to the mixer 714.

The mixer 714 mixes samples y(n) of the original speech input signal with the filtered gained speech samples $y_{fg}(n)$ in amounts proportional to the normalized gain η to generate intelligibility enhanced environment compensated speech samples y'. More specifically, the mixer 714 computes $$y'(n)=y(n)*(1-\eta)+y_{fg}(n)*\eta.$$

Figure 8:
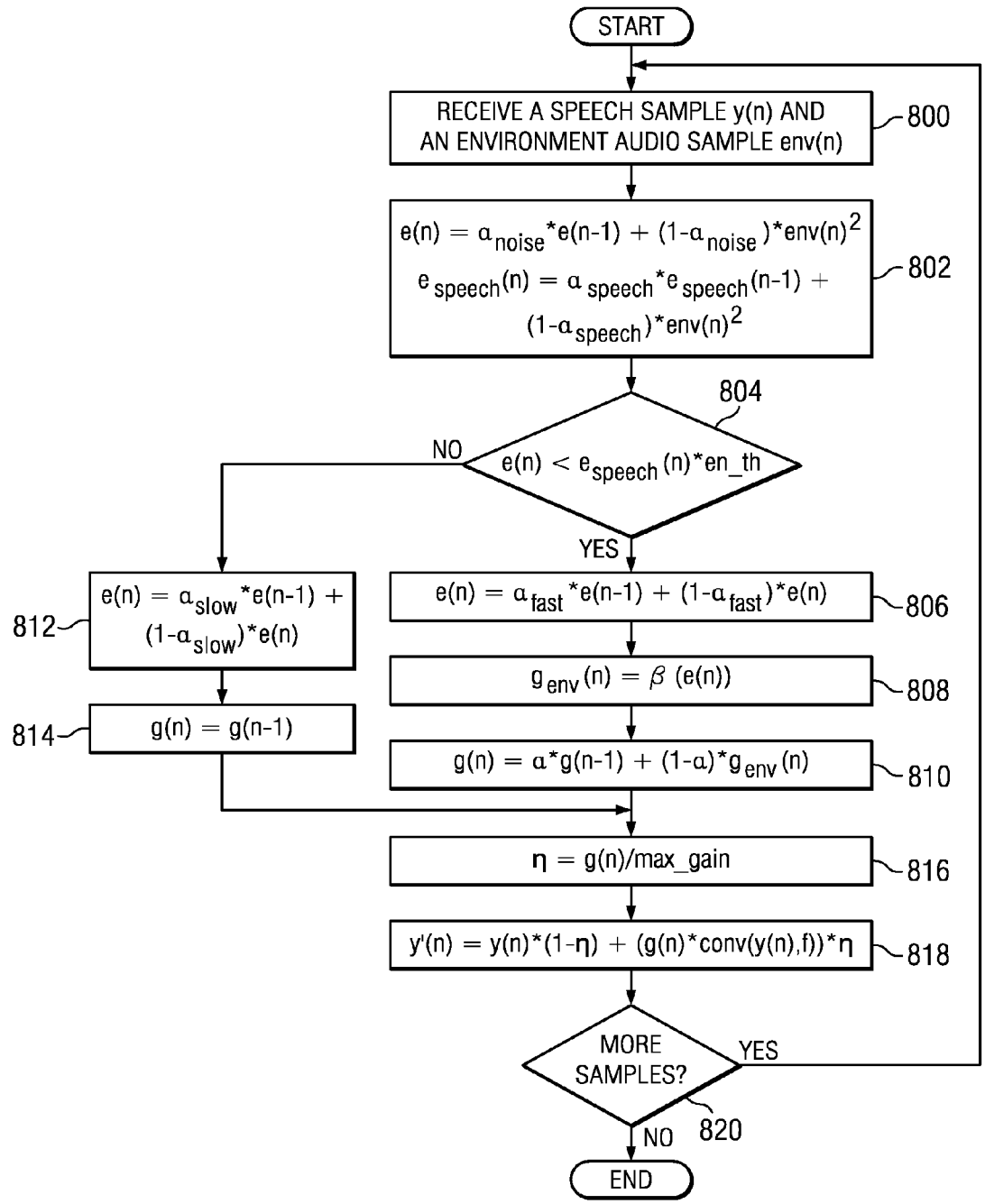

FIG. 8 is a flow diagram of a method for environmental noise compensation of a speech signal in a digital system in which intelligibility of the speech is also enhanced. This method is essentially the method of FIG. 6 with steps added to enhance the intelligibility of the environment compensated speech. Steps 800-814 are the same as steps 600-614 of FIG. 6. Once the gain g(n) is computed at steps 810 or 814, the gain g(n) is normalized 816. Normalization of the gain g(n) and the parameter max_gain are previously described herein. The received sample y(n) of the speech audio signal and the sample after intelligibility boosting are then mixed 818 in amounts proportional to the normalized gain to generate a sample y'(n) of the environment compensated speech signal with intelligibility enhancement. Intelligibility boosting is previously described herein. The method is then repeated 820 for the next speech and environment samples, if any.

Figure 9:
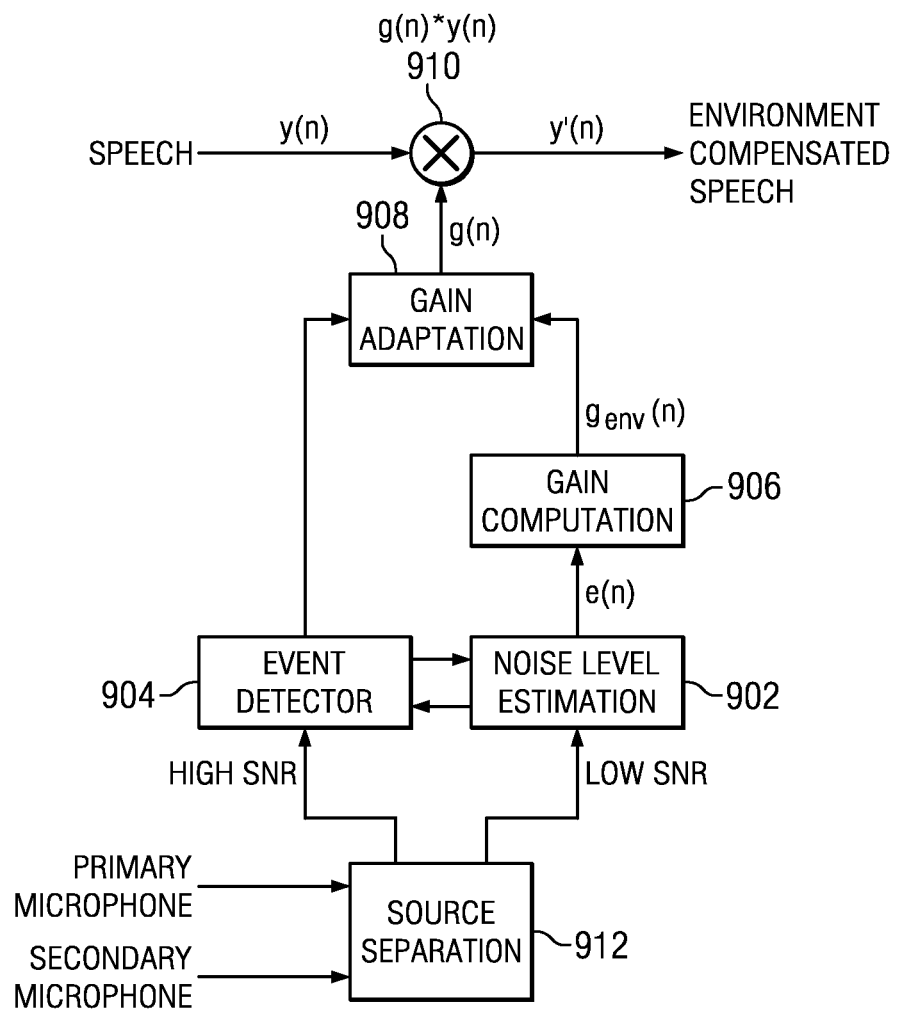

FIG. 9 is a block diagram of a system for environmental noise compensation of a speech audio signal using two microphones, a primary microphone and a secondary microphone. The primary microphone and the secondary microphone may be embodied in a digital system (e.g., a cellular telephone, a speakerphone, a computer system providing VOIP (Voice over Internet Protocol) communication, etc.) and are arranged to capture the speech of a person speaking, and any other sound in the environment where the speech is generated, i.e., ambient noise. Thus, when the person is speaking, the primary audio signal and the secondary audio signal are a mixture of an audio signal with speech content and audio signals from other sounds in the environment. And, when the person is not speaking, the primary and secondary audio signals are mixtures of other sounds in the environment of the person speaking.

The primary microphone and the secondary microphone may be arranged so as to provide diversity between the primary audio signal and the secondary audio signal, with the primary microphone closest to the mouth of the speaker. For example, in a cellular telephone, the primary microphone may be the microphone positioned to capture the voice of the person using the cellular telephone and the secondary microphone may be a separate microphone located in the body of the cellular telephone.

The source separation component 912 receives a primary audio signal from the primary microphone and a secondary audio signal form the secondary microphone and processes the two signals to separate the audio content in the signals into a high signal-to-noise ratio (SNR) audio signal and a low SNR audio signal. The high SNR audio signal is indicative of target speech content in the primary and secondary signals and the low SNR audio signal is indicative of ambient noise content in the primary and secondary signals. Samples s(n) of the high SNR signal are provided to the event detection component 904 and samples env(n) of the low SNR signal are provided to the noise estimation component 902.

The source separation component 912 may use any suitable source separation technique, e.g., beamforming, independent component analysis, blind source separation, or dictionary learning. In general, two channel source separation is based on the difference in correlation between speech and ambient noise in the signal content of the two channels. Further, if beamforming is used, the two channels can be separated based on spatial orientation of the speaker with respect to the microphones and a noise direction other than the speech direction. In some embodiments, the source separation component 912 uses adaptive filters to separate the high SNR (speech) and low SNR (ambient noise) content. An example of a suitable source separation technique that may be used is described in United States Patent Application Publication No. 2011/0123019, entitled "Method and Apparatus for Cross-Talk Resistant Adaptive Noise Canceller," filed Oct. 7, 2010. Another example of a suitable source separation technique that may be used is described in United States Patent Application Publication No. 2011/0064242, entitled "Method and System for Interference Suppression Using Blind Source Separation," filed Sep. 10, 2010.

The noise level estimation component 902 receives samples env(n) of the low SNR audio signal, i.e., the environment audio signal, from the source separation component 912 and estimates the noise energy in the signal in collaboration with the event detection component 904. More specifically, the noise level estimation component 902 implements the noise tracker. When the noise level estimation component 902 receives an environment audio sample env(n), the noise tracker computes a noise energy estimation e(n) based on the received sample env(n) according to the following formula:

$$e(n)=\alpha_{noise}*e(n-1)+(1-\alpha_{noise})*\text{env}(n)^2.$$

The smoothing parameter $\alpha_{noise}$ is previously described herein.

This initial noise energy estimate e(n) is provided to the event detection component 904. The event detection component 904 receives samples s(n) of the high SNR audio signal, i.e., the speech audio signal, from the source separation component 912 and estimates the speech energy in the signal. More specifically, the event detection component 904 implements the speech tracker. When the event detection component 904 receives a speech audio sample s(n), the speech tracker computes a speech energy estimation $e_{speech}$(n) based on the received sample env(n) according to the following formula:

$$e_{speech}(n)=\alpha_{speech}*e_{speech}(n-1)+(1-\alpha_{speech})*s(n)^2.$$

The event detection component 904 compares the initial noise energy estimate e(n) from the noise estimation component 902 and the speech energy estimate $e_{speech}$(n) to an energy level threshold to determine if a high level of energy is present consistent with speech. This comparison is according to the following test:

$$e(n)<e_{speech}(n)*en\_th$$

where en_th is the energy level threshold. The energy level threshold $e_{speech}$(n) is previously described herein. If this test is true, the event detection component 904 indicates no audio event to the noise level estimation component 902 and to the gain adaptation component 908. If the test is false, the event detection component 904 indicates an audio event to the noise level estimation component 902 and to the gain adaptation component 908.

Accordingly, the noise level estimation component 802 modifies the noise energy estimate e(n) for a sample env(n) according whether or not an audio event is indicated by the event detection component 904 from the initial noise and speech energy estimates. The conditional modification of the noise energy estimate e(n) is the same as that described for the noise level estimation component 504 of FIG. 5.

The functionality of the remaining components of the system of FIG. 9, i.e., the gain computation component 906, the gain adaptation component 908, and the multiplier 910, is as previously described in reference to FIG. 5 for components of the same name.

Figure 10:
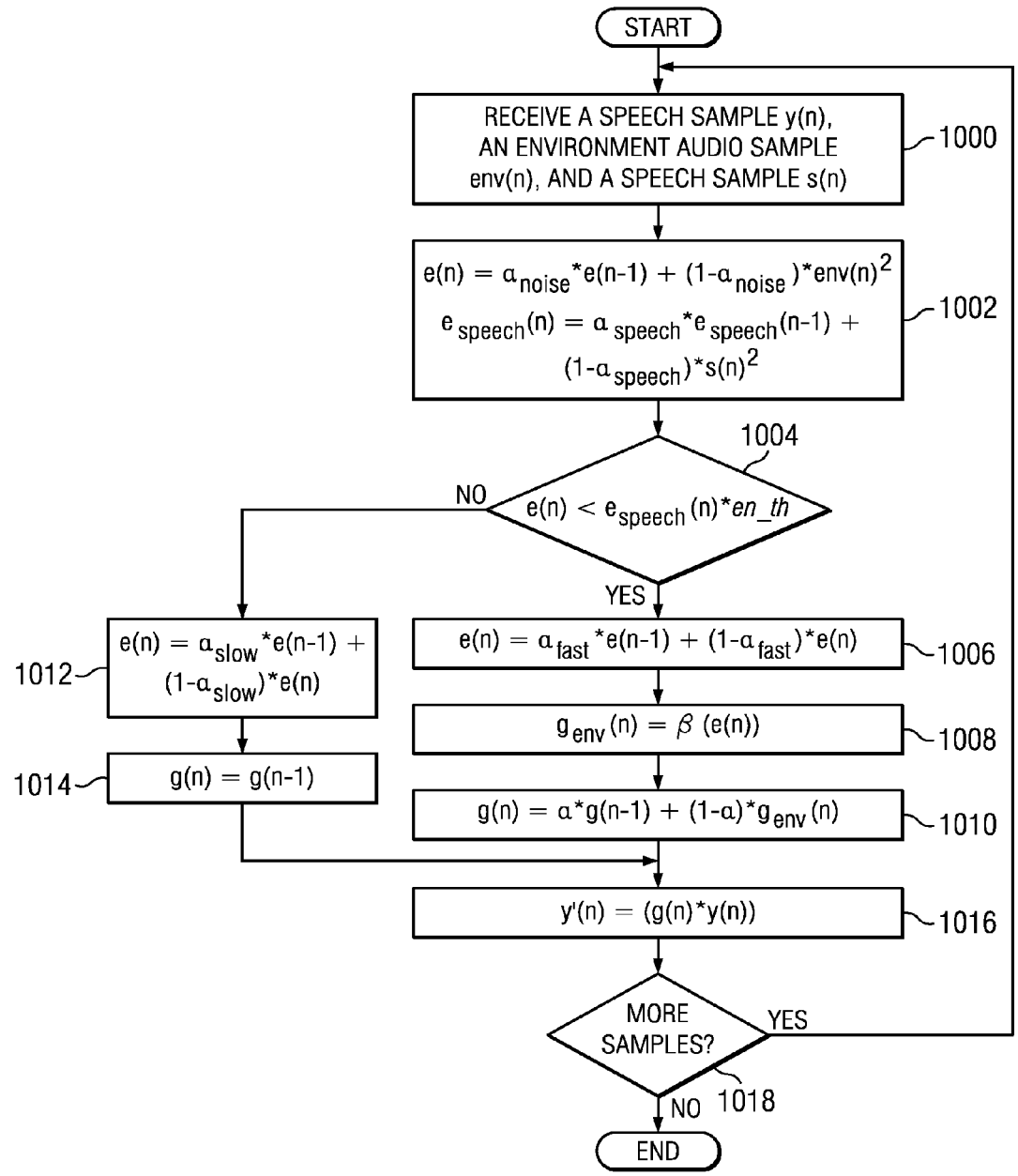

FIG. 10 is a flow diagram of a method for environmental noise compensation of a speech signal in a digital system (e.g., a cellular telephone, a speakerphone, a computer system providing VOIP (Voice over Internet Protocol) communication, etc.). Initially, a sample y(n) of a speech audio signal, a sample env(n) of an environment audio signal, and a speech sample s(n) of another speech audio signal are received 1000. The speech audio signal is received as a transmission from another digital system. The environment audio signal and the other speech audio signal are generated by source separation of audio signals captured from primary and secondary microphones embodied in the digital system. The primary and secondary microphones are arranged to capture the speech of a person speaking, and any other sound in the environment where the speech is generated, i.e., ambient noise. Thus, when the person is speaking, the primary audio signal and the secondary audio signal are a mixture of an audio signal with speech content and audio signals from other sounds in the environment. And, when the person is not speaking, the primary and secondary audio signals are mixtures of other sounds in the environment of the person speaking.

A noise energy estimate e(n) and a speech energy estimate $e_{speech}(n)$ are then updated 1002 based on the received environment audio sample env(n). The smoothing parameters $\alpha_{noise}$ and $\alpha_{speech}$ are previously described herein. The remaining steps 1004-1016 are the same as steps 604-616 of FIG. 6.

Figure 11:
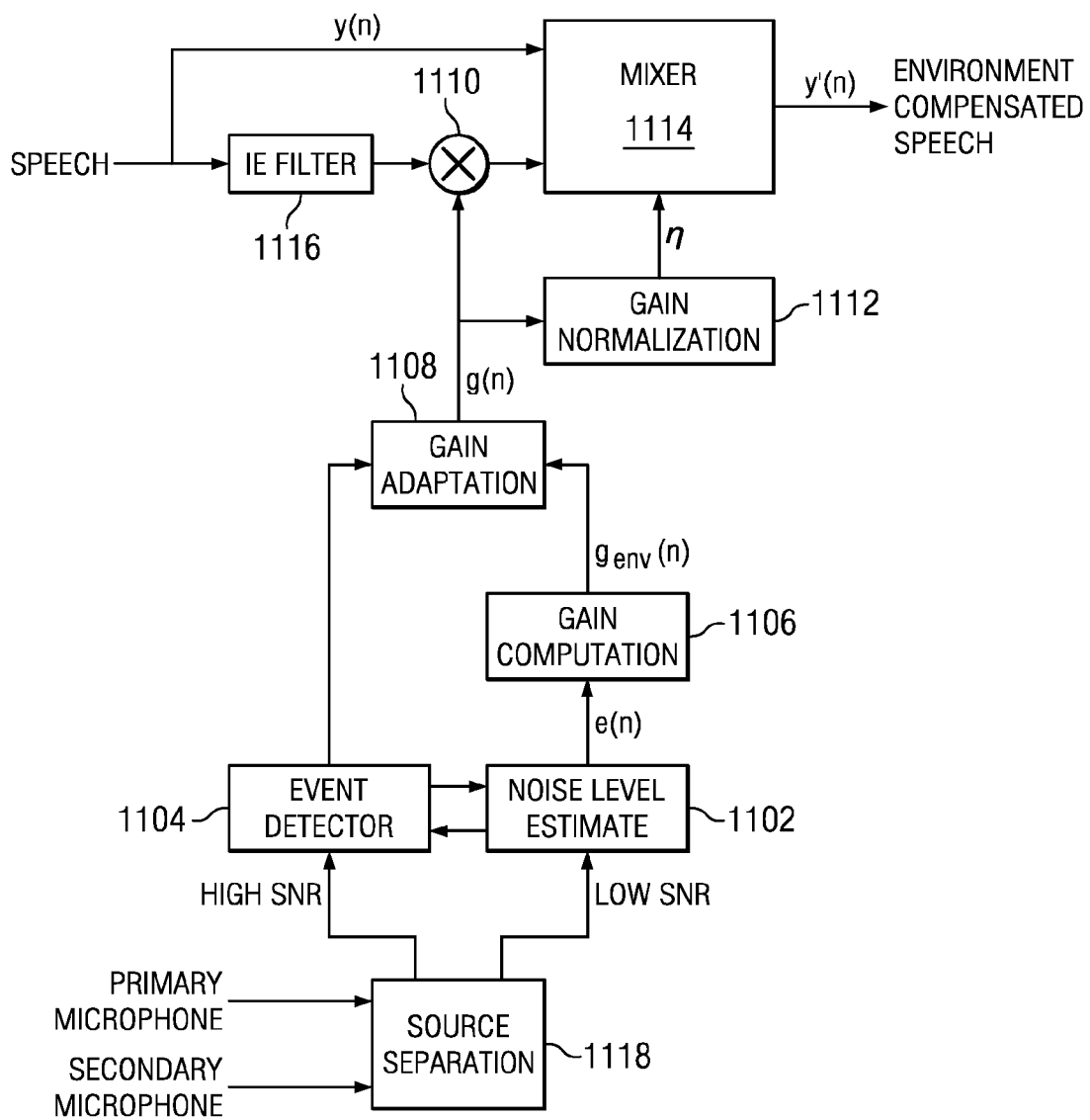

FIG. 11 is a block diagram of a system for environmental noise compensation of a speech audio signal using two microphones, a primary microphone and a secondary microphone, in which intelligibility of the speech is also enhanced. This system is essentially the system of FIG. 9 with components added to enhance the intelligibility of the environment compensated speech. The functionality of the source separation component 1112, the noise level estimation component 1102, the event detection component 1104, the gain computation component 1106, and the gain adaptation component 1108 is as previously described in reference to FIG. 9 for components of the same name. The functionality of the intelligibility enhancement filter component 1116, the multiplier 1110, the gain normalization component 1112, and the mixer component 1114 is as previously described in reference to FIG. 7 for components of the same name.

Figure 12:
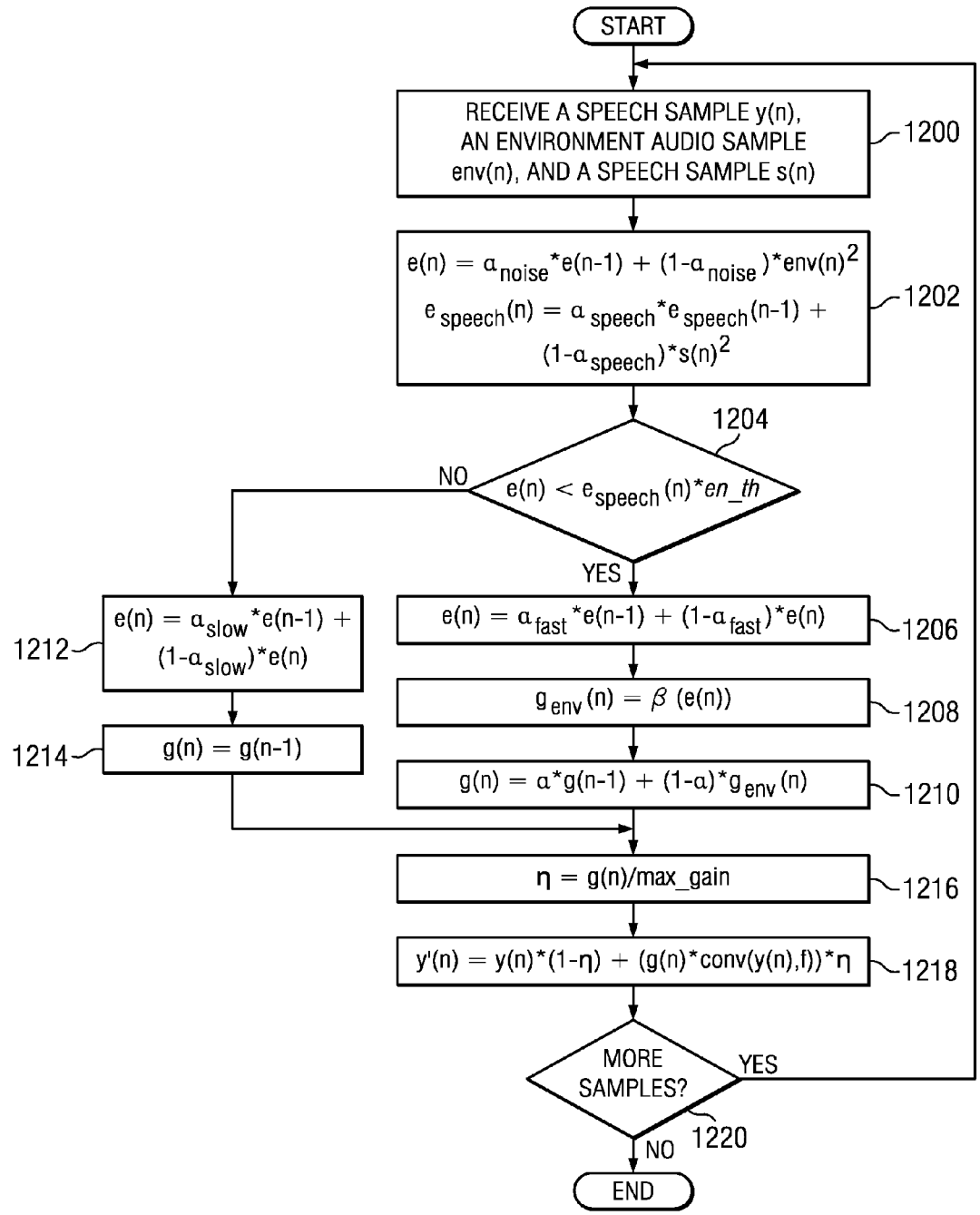

FIG. 12 is a flow diagram of a method for environmental noise compensation of a speech signal in a digital system in which intelligibility of the speech is also enhanced. This method is essentially the method of FIG. 10 with steps added to enhance the intelligibility of the environment compensated speech. Steps 1200-1214 are the same as steps 1000-1014 of FIG. 10. Steps 1216-1220 are the same as steps 816-820 of FIG. 8.

Figure 13:
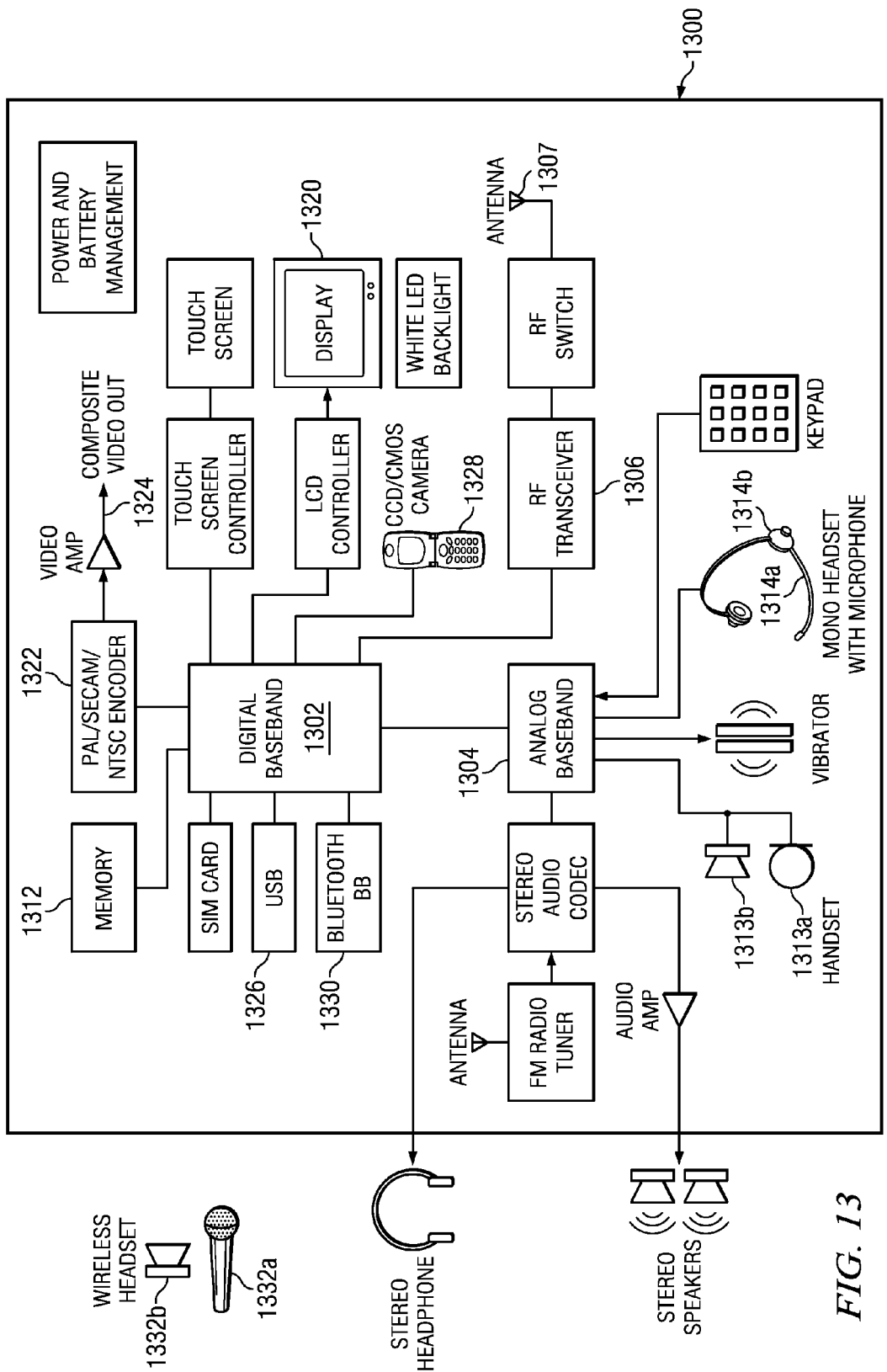
FIG. 13 is a block diagram of an illustrative digital system.

FIG. 13 is a block diagram of an example digital system (e.g., a mobile cellular telephone) 1300 that may be configured to perform methods described herein. The digital baseband unit 1302 includes a digital signal processing system (DSP) that includes embedded memory and security features. The analog baseband unit 1304 receives input audio signals from one or more handset microphones 1313a and sends received audio signals to the handset mono speaker 1313b. The analog baseband unit 1304 receives input audio signals from one or more microphones 1314a located in a mono headset coupled to the cellular telephone and sends a received audio signal to the mono headset 1314b. The digital baseband unit 1302 receives input audio signals from one or more microphones 1332a of the wireless headset and sends a received audio signal to the speaker 1332b of the wireless head set. The analog baseband unit 1304 and the digital baseband unit 1302 may be separate ICs. In many embodiments, the analog baseband unit 1304 does not embed a programmable processor core, but performs processing based on configuration of audio paths, filters, gains, etc being setup by software running on the digital baseband unit 1302.

The RF transceiver 1306 includes a receiver for receiving a stream of coded audio data, i.e., a received audio signal, from a cellular base station via antenna 1007 and a transmitter for transmitting a stream of coded audio data to the cellular base station via antenna 1007. The received coded audio data is provided to the digital baseband unit 1302 for decoding. The digital baseband unit 1302 provides the decoded audio signal to the speaker of the wireless headset 1332b when activated or the analog baseband 1304 for appropriate conversion and playing on an activated analog speaker, e.g., the speaker 1314b or the speaker 1313b.

The display 1320 may display pictures and video streams received from the network, from a local camera 1328, or from other sources such as the USB 1326 or the memory 1312. The digital baseband unit 1302 may also send a video stream to the display 1320 that is received from various sources such as the cellular network via the RF transceiver 1306 or the camera 1326. The digital baseband unit 1302 may also send a video stream to an external video display unit via the encoder unit 1322 over a composite output terminal 1324. The encoder unit 1322 may provide encoding according to PAL/SECAM/NTSC video standards.

The digital baseband unit 1302 includes functionality to perform the computational operations required for audio encoding and decoding. In one or more embodiments, the digital baseband unit 1302 is configured to perform computational operations of a method for environmental noise compensation as described herein as part of decoding an audio signal from the RF transceiver 1306. For the single microphone methods, the environment noise audio signal may be captured from the handset microphone 1313a, a microphone 1314a in the mono headset, or a microphone 1332a in the wireless headset according to which one is activated for a telephone conversation.

For the two microphone methods, the primary audio signal may be captured from the handset microphone 1313a, a microphone 1314a in the mono headset, or a microphone 1332a in the wireless headset according to which one is activated for a telephone conversation and the secondary audio signal may be captured by a different microphone. For example, there may be another microphone in the digital system 1300 positioned on the back of the body to capture audio when a video is being captured by the camera 1328. This microphone may be activated the digital baseband unit 1302 when a telephone conversation is initiated in order to capture the secondary audio signal. In another example, if a microphone in a headset is used to capture the primary audio signal, the handset microphone 1313a may be used to capture the secondary audio signal. Software instructions implementing the method may be stored in the memory 1312 and executed by the digital baseband unit 1302 decoding an audio signal from the RF transceiver 1306.

Other Embodiments

While the invention has been described with respect to a limited number of embodiments, those skilled in the art, having benefit of this disclosure, will appreciate that other embodiments can be devised which do not depart from the scope of the invention as disclosed herein.

For example, while embodiments may have been described herein primarily in reference to cellular telephones, one of ordinary skill in the art will understand that embodiments of the methods may be implemented for virtually any suitably configured digital system with functionality to receive and replay audio signals and to capture one or two audio signals from the environment in which the digital system is deployed. Such digital systems may include, for example, a desk top computer, a laptop computer, a multimedia communication device such as an Android® device or an Apple® iPhone®, a personal digital assistant, a Voice over Internet Protocol (VOIP) communication device such as a telephone, server or personal computer, a speakerphone, a hands free cellular communication system in an automobile, or a Bluetooth audio headset.

Android is registered trademark of Google, Inc. and Apple and iPhone are registered trademarks of Apple, Inc.

In another example, while embodiments have been described in which environmental noise compensation is applied to each sample of the received speech signal, the speech signal and/or the environment signal may be down-sampled.

In another example, while embodiments have been described herein in which two microphones are used, one of ordinary skill in the art will understand other embodiments in which more than two microphones may be used. For example, if more than two microphones are used, the signal levels from each of the microphones may be determined during source separation and compared. The two signals that have the largest signal level difference may then be selected for generating the high SNR signal and the low SNR signal.

In another example, while embodiments have been described here in which energy threshold based VAD is used, other suitable VAD techniques may be used, such as a statistical model based VAD or a VAD technique that includes speech enhancement of the signal(s) prior to the VAD computation.

Embodiments of the methods and systems described herein may be implemented in hardware, software, firmware, or any combination thereof. If completely or partially implemented in software, the software may be executed in one or more processors, such as a microprocessor, application specific integrated circuit (ASIC), field programmable gate array (FPGA), or digital signal processor (DSP). The software instructions may be initially stored in a computer-readable medium and loaded and executed in the processor. In some cases, the software instructions may also be sold in a computer program product, which includes the computer-readable medium and packaging materials for the computer-readable medium. In some cases, the software instructions may be distributed via removable computer readable media, via a transmission path from computer readable media on another digital system, etc. Examples of computer-readable media include non-writable storage media such as read-only memory devices, writable storage media such as disks, flash memory, memory, or a combination thereof.

Although method steps may be presented and described herein in a sequential fashion, one or more of the steps shown in the figures and described herein may be performed concurrently, may be combined, and/or may be performed in a different order than the order shown in the figures and/or described herein. Accordingly, embodiments should not be considered limited to the specific ordering of steps shown in the figures and/or described herein.

It is therefore contemplated that the appended claims will cover any such modifications of the embodiments as fall within the true scope of the invention.

What is claimed is:

1. A method automatically performed by a system for environmental noise compensation of a first speech captured by a first audio capture device in a speech audio signal outside of an audio environment, the method comprising:
    estimating a fast audio energy level and a slow audio energy level from an environment audio signal captured by a second audio capture device in the audio environment, wherein:
    the fast audio energy level corresponds to a second speech captured in the audio environment, and
    the slow audio energy level corresponds to an ambient noise captured in the audio environment;
    applying a gain to the speech audio signal to generate an environment compensated speech audio signal;
    determining either a presence or an absence of an audio event by comparing the fast audio energy level with the slow audio energy level against a predetermined energy threshold;
    updating the gain based on the estimated slow audio energy level during the absence of the audio event; and
    freezing the gain at a current level during the presence of the audio event.

2. The method of claim 1, wherein estimating the fast audio energy level comprises estimating the fast audio energy level from the environment audio signal captured by the second audio capture device in the audio environment.

3. The method of claim 1, wherein estimating the fast audio energy level comprises estimating the fast audio energy level based on a primary audio signal captured by a primary audio capture device in the audio environment and a secondary audio signal captured by a secondary audio capture device in the audio environment.

4. The method of claim 1, wherein estimating the fast audio energy level comprises:
    adapting the estimated slow audio energy level in proportion to a slow adaptation parameter when the estimated fast audio energy level is indicative of the audio event; and
    adapting the estimated slow audio energy level in proportion to a fast adaptation parameter when the estimated fast audio energy level is not indicative of the audio event.

5. The method of claim 1, further comprising:
    filtering the speech audio signal;
    normalizing the gain based on a maximum gain; and
    wherein applying a gain comprises:
        applying the gain to the filtered speech audio signal; and
        mixing the gained, filtered speech audio signal and the speech audio signal in amounts proportional to the normalized gain to generate the environment compensated speech audio signal.

6. A method performed by a system for environmental noise compensation of a first speech captured by a first audio capture device in a speech audio signal outside an audio environment, the method comprising:
    tracking a noise level and a speech level from samples of an environment audio signal captured by a second audio capture device in the audio environment, wherein:
    the speech level corresponds to a second speech in the audio environment, and
    the noise level corresponds to an ambient noise in the audio environment;
    determining either a presence or an absence of the second speech in the audio environment by comparing the noise level and the speech level against a predetermined threshold;
    updating a gain based on the noise level during the absence of the second speech;
    freezing the gain at a current level during the presence of the second speech; and
    applying the gain to the speech audio signal to generate an environment compensated speech audio signal.

7. The method of claim 6, wherein tracking the noise level comprises estimating the noise level from the samples of the environment audio signal captured by the second audio capture device in the audio environment.

8. The method of claim 6, wherein tracking the noise level comprises estimating the noise level based on a primary audio signal captured by a primary audio capture device in the audio environment and a secondary audio signal captured by a secondary audio capture device in the audio environment.

9. The method of claim 6, wherein tracking the noise level comprises:
adapting the estimated noise level in proportion to a slow adaptation parameter when the second speech is present in the audio environment; and
adapting the estimated noise level in proportion to a fast adaptation parameter when the second speech is not present in the audio environment.

10. The method of claim 6, further comprising:
filtering the speech audio signal;
normalizing the gain based on a maximum gain; and
wherein applying the gain comprises:
applying the gain to the filtered speech audio signal; and
mixing the gained, filtered speech audio signal and the speech audio signal in amounts proportional to the normalized gain to generate the environment compensated speech audio signal.

11. A digital system comprising:
a processor;
means for receiving an audio signal captured by a first audio capture device in an audio environment;
means for receiving a speech audio signal carrying a first speech captured by a second audio capture device outside of the audio environment; and
a non-transitory memory configured to store instructions that, when executed by the processor, cause the digital system to perform a method comprising:
estimating a fast audio energy level corresponding to a second speech captured in the audio environment;
estimating a slow audio energy level corresponding to an ambient noise captured in the audio environment;
applying a gain to the speech audio signal to generate an environment compensated speech audio signal;
determining either a presence or an absence of an audio event by comparing the fast audio energy level with the slow audio energy level against a predetermined energy threshold;
updating the gain based on the estimated slow audio energy level during the absence of the audio event; and
freezing the gain at a current level during the presence of the audio event.

12. The digital system of claim 11, wherein the first audio capture device is configured to capture the environment audio signal, and wherein estimating the fast audio energy level comprises estimating the fast audio energy level and the slow audio energy level from the environment audio signal.

13. The digital system of claim 11, wherein the first audio capture device includes a primary audio capture device configured to capture a primary audio signal and a secondary audio capture device configured to capture a secondary audio signal, and wherein estimating the fast audio energy level comprises estimating the fast audio energy level and the slow audio energy level based on the primary audio signal and the secondary audio signal.

14. The digital system of claim 11, wherein estimating the fast audio energy level comprises:
adapting the estimated slow audio energy level in proportion to a slow adaptation parameter when the estimated fast audio energy level is indicative of an audio event; and
adapting the estimated slow audio energy level in proportion to a fast adaptation parameter when the estimated fast audio energy level is not indicative of an audio event.

15. The digital system of claim 11, the method further comprising:
filtering the speech audio signal;
normalizing the gain based on a maximum gain; and
wherein applying a gain comprises:
applying the gain to the filtered speech audio signal; and
mixing the gained, filtered speech audio signal and the speech audio signal in amounts proportional to the normalized gain to generate the environment compensated speech audio signal.

* * * * *